(12) United States Patent
Ooi et al.

(10) Patent No.: US 7,285,856 B2
(45) Date of Patent: Oct. 23, 2007

(54) PACKAGE FOR SEMICONDUCTOR DEVICES

(75) Inventors: Kazuhiko Ooi, Nagano (JP); Tadashi Kodaira, Nagano (JP); Eisaku Watari, Nagano (JP); Jyunichi Nakamura, Nagano (JP); Shunichiro Matsumoto, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 296 days.

(21) Appl. No.: 10/855,979

(22) Filed: May 28, 2004

(65) Prior Publication Data

US 2005/0006744 A1    Jan. 13, 2005

(30) Foreign Application Priority Data

May 30, 2003    (JP)    ............................. 2003-155333

(51) Int. Cl.
*H05K 3/46*    (2006.01)
(52) U.S. Cl. ...................... 257/739; 257/633; 257/686; 257/E21.512; 257/E23.11
(58) Field of Classification Search ............... 257/686, 257/739
See application file for complete search history.

(56) References Cited

U.S. PATENT DOCUMENTS 6,350,952 B1 *  2/2002  Gaku et al. .................. 174/522

6,418,615 B1     7/2002  Rokugawa et al.
6,525,921 B1 *   2/2003  Nakatani et al. .......... 361/306.3
6,756,663 B2 *   6/2004  Shiraishi et al. ............ 257/686
2002/0001937 A1  1/2002  Kikuchi et al.

FOREIGN PATENT DOCUMENTS

| | | |
|---|---|---|
| JP | 11-163208 | 6/1999 |
| JP | 2000-031642 | 1/2000 |
| JP | 2000-323613 | 11/2000 |
| JP | 2001-036253 | 2/2001 |
| JP | 2001-274556 | 10/2001 |
| JP | 2002-016173 | 1/2002 |

* cited by examiner

*Primary Examiner*—Andy Nguyen
*Assistant Examiner*—Dao H. Nguyen
(74) *Attorney, Agent, or Firm*—Staas & Halsey LLP

(57) ABSTRACT

To prevent the occurrence of stress in the junction portion between the semiconductor element and the semiconductor package mounting the semiconductor element, so that cracks will not occur even when there is mounted a semiconductor element having a small strength. A package for semiconductor devices is formed as a laminate (20) of many layers including a plurality of conducting layers and insulating resin layers that are alternately laminated one upon other and having, on one surface of the laminate, a portion for mounting a semiconductor element. The whole regions or some regions of the insulating resin layers (20d to 20f) of the laminate, including at least the portion for mounting the semiconductor element and the peripheries thereof, are constituted by a prepreg obtained by impregnating a woven fabric of a liquid crystal polymer with an insulating resin.

4 Claims, 5 Drawing Sheets

PACKAGE FOR SEMICONDUCTOR DEVICES

BACKGROUND OF THE INVENTION

1. Field of the Invention

The present invention relates to a package, for semiconductor devices, for mounting semiconductor elements. More specifically, the invention relates to a package for semiconductor devices formed as a laminate of many layers including a plurality of conducting layers and insulating resin layers that are alternately laminated one upon other and having, on one surface thereof, a portion for mounting a semiconductor element, or, further, having one or a plurality of insulating resin layers on the upper surface of the laminate of many layers and having, on the upper surface of the uppermost insulating resin layer thereof, a portion for mounting a semiconductor element, featuring improved junction strength in the junction portion between the semiconductor element and the semiconductor package. The present invention further relates to an interposer disposed between the semiconductor element and the semiconductor package.

2. Description of the Related Art

In many cases, in the conventional art, an insulating resin has been used alone as a material of insulating resin layers for a multi-layer package for semiconductor devices, comprising a laminate of many layers obtained by alternately laminating a plurality of conducting layers and insulating resin layers and, particularly, as a material of insulating resin layers for a multi-layer semiconductor substrate or a semiconductor package of which all the layers are formed by a build-up process. Therefore, the package for mounting the semiconductor element by itself has a small strength but a large coefficient of linear thermal expansion. In particular, if the coefficient of linear thermal expansion of the insulating resin layer is greatly different from the coefficient of linear thermal expansion of the semiconductor element that is mounted, thermal stress occurs between the semiconductor element and the package at the time of mounting the semiconductor element on the package in the step of reflowing the solder, causing a problem in that the package or the semiconductor element is damaged.

In order to enhance the strength of the semiconductor package, further, a multi-layer substrate is often produced by using an insulating resin layer by incorporating a glass cloth therein. When the multi-layer resin substrate incorporating the glass cloth is used, however, the via-holes or through holes tend to be deformed at the time of being perforated in the package by the irradiation with a laser beam. When the through holes are to be plated, further, the plating is not favorably accomplished. In such a case, too, the coefficient of linear thermal expansion of the insulating resin layer is about 15 ppm at the smallest which, however, cannot be brought close to the coefficient of linear thermal expansion of the semiconductor element itself any more.

In order to reinforce the semiconductor package, further, the package may be surrounded by a reinforcing material (stiffener). In general, however, the package has a coefficient of linear thermal expansion which is greater than that of the conventional reinforcing member. Therefore, when the semiconductor element is to be mounted on the package by reflowing the solder, the central portion of the package expands more than the outer peripheries making it difficult to accomplish a favorable electric connection to the semiconductor element.

If viewed from the side of the semiconductor element, further, the material used as the semiconductor element, usually, has a low dielectric constant and is very brittle and tends to be easily broken. Therefore, the stress must be decreased as much as possible in the junction portion between the semiconductor element and the package.

Related arts have been disclosed in the following documents. For example, Japanese Unexamined Patent Publication (Kokai) No. 11-163208 discloses the use of a prepreg obtained by using a nonwoven fabric of a liquid crystal polyester as a base material of multi-layer printed board, and impregnating it with a thermosetting resin component. Japanese Unexamined Patent Publication (Kokai) No. 2000-31642 discloses the use of a liquid crystal polyester or a polyarylate as a resin for forming an insulating layer on the built-up multi-layer circuit board, and roughening of the surface of the insulating resin sheet by sand-blasting. Further, Japanese Unexamined Patent Publication (Kokai) No. 2002-16173 discloses the insulating layer of the semiconductor device that is constituted by using a resin and a glass cloth, a nonwoven fabric of a glass, a polyamide-type nonwoven fabric or a liquid crystal polymer-type nonwoven fabric.

Japanese Unexamined Patent Publication (Kokai) No. 2000-323613 discloses a multi-layer substrate for semiconductor devices contriving the shape of the via-holes for interlayer connection in order to flatten the surface for mounting the semiconductor element as much as possible and to decrease the thickness as much as possible. Japanese Unexamined Patent Publication (Kokai) No. 2001-36253 discloses an insulating resin layer that is partly constituted by using a resin layer of a low elasticity to absorb stress generated due to a difference in the coefficient of thermal expansion from an electronic part such as a semiconductor element that is mounted. Further, Japanese Unexamined Patent Publication (Kokai) No. 2001-274556 discloses laminating a thermally expanding buffer sheet having a coefficient of thermal expansion of 6 to 12 ppm integrally on a printed wiring board on which a surface-mounting part is to be mounted to obtain a printed wiring board for surface mounting maintaining excellent reliability in the connection to the surface-mounted part. Japanese Unexamined Patent Publication (Kokai) No. 2002-83893 discloses a multi-layer wiring structure film having improved flatness using a metal base as a reinforcing material, laminating a multi-layer wiring structure film on a metal base made of a metal plate and having an opening for inserting a semiconductor element, inserting the semiconductor element in the opening of the metal base, and connecting a flip chip.

According to the prior art, as described above, problems have not been solved to a sufficient degree in regard to forming via-holes and through holes by using a laser beam, adhesion of plating in the through holes and strength of the semiconductor package itself. In the step of producing a semiconductor device, further, when the semiconductor element is to be mounted on the package by reflowing the solder, the central portion of the package expands more than the outer peripheries thereof due to a difference in the coefficient of linear thermal expansion between the central portion of the package on where the semiconductor element is mounted and the outer peripheries thereof due to the temperature, and stress occurs between the semiconductor element and the package, thus leaving problems. The problem has not been fully solved, either, concerning the stress between the semiconductor element and the package as a result of thermal expansion when the semiconductor element is in operation.

SUMMARY OF THE INVENTION

From the foregoing, therefore, it is an object of the present invention to provide a package for semiconductor devices that prevents the occurrence of stress in the junction portion between the semiconductor element and the semiconductor package mounting the semiconductor element, that stems from a difference in the coefficient of linear thermal expansion therebetween, and maintains a sufficient strength in the junction portion between the semiconductor element and the package, even if a semiconductor element having a small strength is used.

In order to achieve the above assignment according to the present invention, there is provided a package for a semiconductor device formed as a laminate of many layers including a plurality of conducting layers and insulating resin layers that are alternately laminated one upon other and having, on one surface of the laminate, a portion for mounting a semiconductor element, wherein the whole regions or some regions of the insulating resin layers of said laminate including at least said portion for mounting the semiconductor element and the peripheries thereof, are constituted by a prepreg obtained by impregnating a woven fabric of a liquid crystal polymer with an insulating resin.

According to the present invention, there is further provided a package for a semiconductor device, comprising a laminate of many layers including a plurality of conducting layers and insulating resin layers that are alternately laminated one upon other, at least two insulting resin layers laminated on the upper surface of said laminate and including a first layer serving as the uppermost layer and a second layer forming a next layer under the uppermost layer, and a portion defined on the upper surface of said first layer and for mounting a semiconductor element, wherein said first layer is constituted by an insulating resin having a coefficient of linear thermal expansion smaller than a coefficient of linear thermal expansion of the semiconductor element that is to be mounted, and said second layer is constituted by a material having a low Young's modulus and a high percentage of elongation.

There is further provided a package for a semiconductor device, comprising a laminate of many layers including a plurality of conducting layers and insulating layers that are alternately laminated one upon the other, at least one insulating layer including a first layer serving as the uppermost layer, and a portion defined on the upper surface of said first layer and for mounting a semiconductor element, wherein said first layer is constituted by a material having a low Young's modulus and a high percentage of elongation.

A feature resides in that the first layer has a slit formed along the periphery of the portion for mounting the semiconductor element to absorb a difference in the stress between the portion mounting the semiconductor element and the surrounding region.

A feature resides in that a reinforcing member (stiffener) is secured to one surface of said laminate or to said first layer so as to surround the portion for mounting the semiconductor element.

According to the present invention, further, there is provided an interposer interposed between a semiconductor element and a package having a portion for mounting said semiconductor element thereby to electrically connect a plurality of electrode terminals of the semiconductor element to a plurality of pad portions of the package, said interposer comprising a plate-like interposer body made of an elastic material having rubbery elasticity, a plurality of first terminals protruding from one surface of said body and are joined to the plurality of electrode terminals of said semiconductor element, and a plurality of second terminals protruding from the other surface of said body and are joined to said plurality of pad portions of said package. In this case, the interposer body contains an insulating mesh therein.

According to the present invention, further, there is provided an interposer interposed between a semiconductor element and a package having a portion for mounting said semiconductor element thereby to electrically connect a plurality of electrode terminals of the semiconductor element to a plurality of pad portions of the package, said interposer comprising a plate-like interposer body obtained by sticking together a first plate-like member made of a material having a coefficient of linear thermal expansion the same as, or close to, that of silicon constituting a principal material of said semiconductor element and a second plate-like member made of a material having a coefficient of linear thermal expansion the same as, or close to, that of an insulating resin constituting a principal material of said package, a plurality of first terminals protruding from the surface of the first plate-like member of said body and are joined to the plurality of electrode terminals of said semiconductor element, and a plurality of second terminals protruding from the surface of the second plate-like member of said body and are joined to said plurality of pad portions of said package.

According to the present invention, further, there is provided a package for a semiconductor device, comprising a laminate of many layers including a plurality of conducting layers and insulating resin layers alternately laminated one upon the other, at least one insulating resin layer laminated on the upper surface of said laminate and including at least a first layer serving as the uppermost layer, and a portion defined on the upper surface of said first layer and for mounting a semiconductor element, wherein said first layer is a stress buffer layer having rubbery elasticity. In this case, too, the first layer which is the stress buffer layer includes an insulating mesh therein.

According to the present invention, further, there is provided a package for a semiconductor device, comprising a laminate of many layers including a plurality of conducting layers and insulating resin layers alternately laminated one upon the other, at least one insulating resin layer laminated on the upper surface of said laminate and including at least a first layer serving as the uppermost layer, and a portion defined on the upper surface of said first layer and for mounting a semiconductor element, wherein said first layer is made of a material having a coefficient of linear thermal expansion the same as, or close to, that of silicon constituting a chief material of the semiconductor element.

According to the present invention, further, there is provided a package for a semiconductor device, comprising a laminate of many layers including a plurality of conducting layers and insulating resin layers alternately laminated one upon the other, at least one insulating resin layer laminated on the upper surface of said laminate and including at least a first layer serving as the uppermost layer, and a portion defined on the upper surface of said first layer and for mounting a semiconductor element, wherein at least the region of said portion for mounting the semiconductor element of said first layer has a plurality of grooves or slits formed therein for reducing the stress.

DETAILED DESCRIPTION OF THE PREFERRED EMBODIMENTS

Embodiments of the invention will now be described in detail with reference to the accompanying drawings.

Figure 1A:
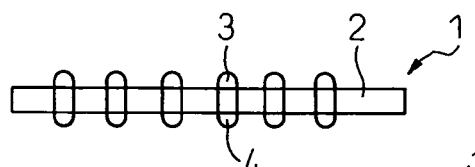
FIGS. 1(*a*) and 1(*b*) illustrate an example of an elastic film applied to an interposer.
Figure 1B:
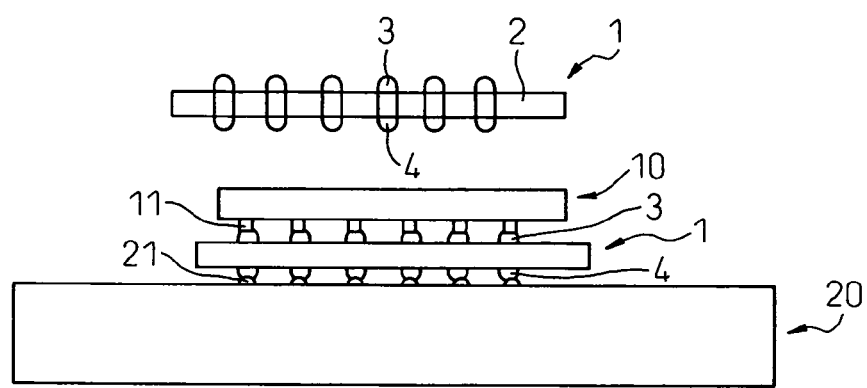
Figure 2:
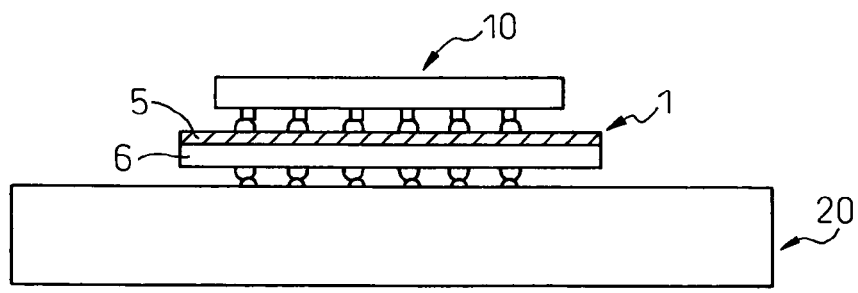
FIG. 2 illustrates an example in which a silicon plate or a liquid crystal polymer film is used for the interposer on the element side.
Figure 3:
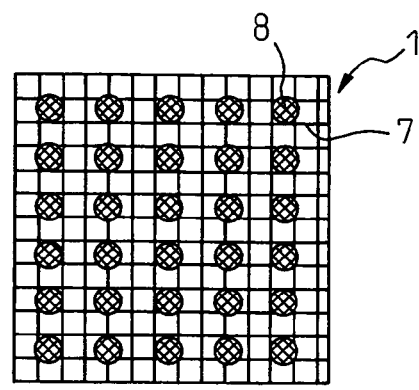
FIG. 3 illustrates an example in which an insulating mesh is used as a material of the interposer.

Referring to FIGS. 1 to 3, an interposer is disposed between a semiconductor element and a semiconductor package in order to reduce the stress therebetween or to not produce stress therebetween.

FIG. 1(a) illustrates an interposer made by using, as an interposer material, an elastic material like a rubber having rubber elasticity, such as an elastic film, and FIG. 1(b) illustrates a state where the semiconductor element is mounted on the semiconductor package by using the interposer. A plurality of conducting terminals 3 and 4 are protruding upward and downward from both surfaces of a film 2 that constitutes the interposer 1. In the step of reflowing the solder, a plurality of electrode terminals 11 of the semiconductor element 10 are connected to the upper terminals 3 of the interposer 1, and the lower terminals 4 of the interposer 1 are connected to a plurality of pad portions 21 of a semiconductor package 20, so that the semiconductor element 10 is mounted on the semiconductor package 20.

The elastic film 2 forming the interposer 1 absorbs a difference in the distortion due to a difference in the coefficient of linear thermal expansion between the semiconductor element 10 and the semiconductor package 20, and the stress can be reduced. In this case, the effect for substantially reducing the stress is exhibited when the film forming the interposer 1 has a thickness of not smaller than 200 μm.

FIG. 2 illustrates the interposer 1 which is a synthetic plate obtained by sticking together a silicon (Si) plate or a liquid crystal polymer film 5 on the side of the semiconductor element and a film 6, on the side of the semiconductor package, having a coefficient of linear thermal expansion which is the same as that of an insulating resin constituting the semiconductor package.

The silicon (Si) plate or the liquid crystal polymer film 5 has a coefficient of thermal expansion the same as, or close to, that of silicon (Si) forming the base material of the semiconductor element 10, while the film 6 has a coefficient of linear thermal expansion the same as, or close to, that of the insulating resin such as an epoxy or a polyimide which is a principal material constituting the semiconductor package 20. Even under a heated environment such as when reflowing solder, therefore, there occurs no stress between the semiconductor element 10 and the silicon (Si) plate or the liquid crystal polymer film 5 forming the interposer 1, and there occurs no stress, either, between the resin film 6 of the interposer 1 and the insulating resin which is the principal material of the semiconductor package 20.

As for the resin film 6 forming the interposer 1, further, even if there is a difference to some extent in the coefficient of linear thermal expansion between the film 6 and the insulating resin of the semiconductor package 20, the stress is substantially completely absorbed between the upper film 5 and the lower film 6 of the interposer 1, though it may differ depending upon the material of the resin film 6. Otherwise, a stress may only be generated on the semiconductor package 20 side of the interposer 1. Here, however, the silicon (Si) plate or the liquid crystal polymer film has such a large strength that the interposer or the semiconductor package is not destroyed.

Referring to FIG. 3, an insulating mesh (woven fabric) 7 is used as a material of the interposer 1, and stress occurring between the semiconductor element 10 and the semiconductor package 20 is reduced by utilizing the voids of the mesh 7. Concretely speaking, in the interposer of FIG. 3, the insulating mesh such as of a liquid crystal polymer is partly impregnated with an electrically conducting paste to form pads for rendering the upper surface and the lower surface of the mesh 7 to be conductive to each other. Otherwise, pads 8 are formed by plating to render the upper surface and the lower surface of the mesh to be conductive to each other. The upper surfaces of the pads 8 are connected to the electrodes of the semiconductor element 10, and the lower surfaces thereof are connected to the pad portions of the semiconductor package 20.

Figure 4:
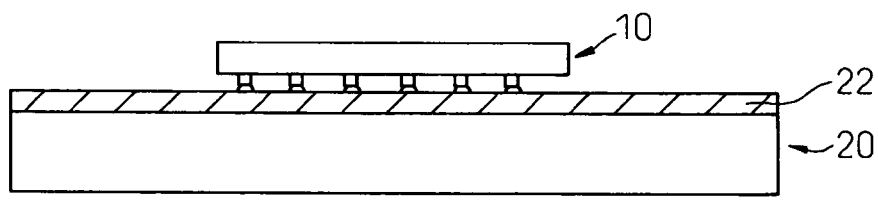
FIG. 4 illustrates an example in which an elastic material for the built-up substrate is used on the element side.
Figure 5:
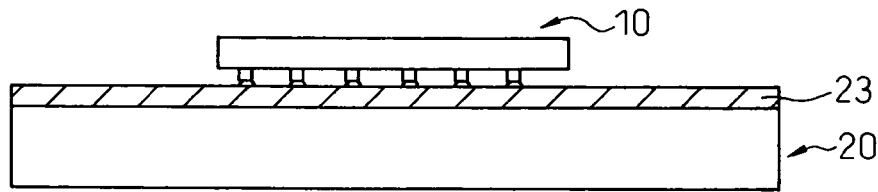
FIG. 5 illustrates an example in which a silicon plate is used for the built-up substrate on the element side.

FIGS. 4 and 5 illustrate an example in which a stress buffer layer is incorporated in the uppermost layer of the built-up substrate which is the semiconductor package, i.e., in the uppermost layer of the built-up substrate including a portion for mounting the semiconductor element. The example of FIG. 4 uses, as the stress buffer layer 22, an elastic material such as a rubber, i.e., an elastomer like silicone. The example of FIG. 5 uses, as the stress buffer layer 23, a silicon (Si) plate made of the same material, i.e., silicon which is forming the semiconductor element 10. In these examples, the stress buffer layers 22 and 23 are laminated on the uppermost layers only in the step of laminating the layers of the semiconductor package by a conventionally known build-up method.

Figure 6:
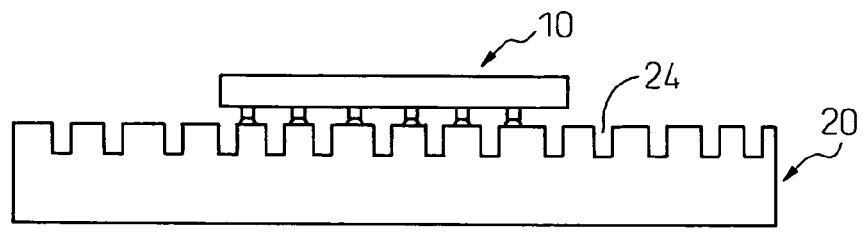
FIG. 6 illustrates an example in which many grooves are formed in the package on the element side.
Figure 7:
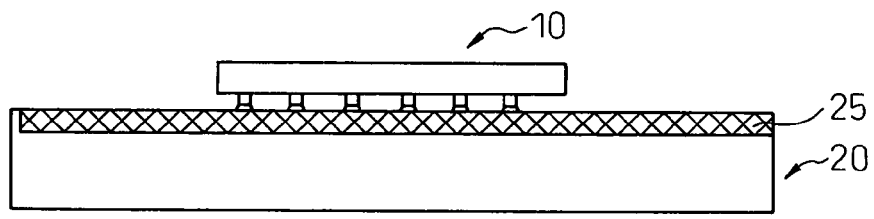
FIG. 7 illustrates an example in which a structure having mesh-like voids is incorporated in the package on the element side.

FIGS. 6 and 7 are examples of reducing the stress by providing a gap in the region of the semiconductor package on the side of the semiconductor element. In the structure of FIG. 6, a plurality of grooves or slits 24 are provided in a region of the semiconductor package 20 on the side of the semiconductor element so that, when the semiconductor element is joined thereto, the stress in the surface portion of the semiconductor package 20 inclusive of the portion for mounting the semiconductor element is absorbed and reduced by the grooves or the slits 24. In FIG. 7, the layer or the region of the semiconductor package on the side of the semiconductor element has a void structure 25 like that of mesh. The void structure absorbs the stress produced between the semiconductor element and the package 20 when the semiconductor is joined thereto. More concretely speaking, the structure 25 of FIG. 7 comprises an insulating mesh such as of a liquid crystal polymer, and the mesh is partly impregnated with an electrically conducting paste to form pads for rendering the upper surface and the lower surface of the mesh to be conductive to each other. Otherwise, pads are formed by plating to render the upper surface and the lower surface of the mesh to be conductive to each other.

Figure 8:
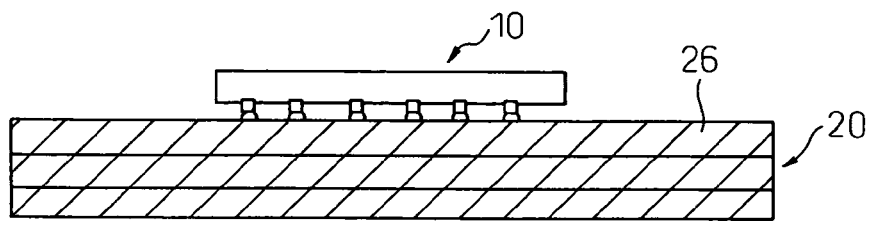
FIG. 8 illustrates an example in which the coefficients of linear thermal expansion equalized between the package and the element.

Referring to FIG. 8, the layers 26 constituting the multi-layer substrate of the semiconductor package 20 are constituted by using a material obtained by impregnating a mesh of a liquid crystal polymer with an insulating resin to bring the coefficient of linear thermal expansion of the semiconductor package close to the coefficient of linear thermal expansion of the semiconductor element. By using the material obtained impregnating the mesh (woven fabric) of the liquid crystal polymer with an insulating resin such as an epoxy or a polyimide, the coefficient of linear thermal expansion of the semiconductor package 20 is lowered and is brought close to the coefficient of linear thermal expansion of the semiconductor element 10 itself. When the semiconductor element 10 is joined, therefore, the stress is reduced in the junction portion between the semiconductor element 10 and the semiconductor package 20. As the liquid crystal polymer, there can be used the one of the polyester type or of the polyarylate type.

Figure 9A:
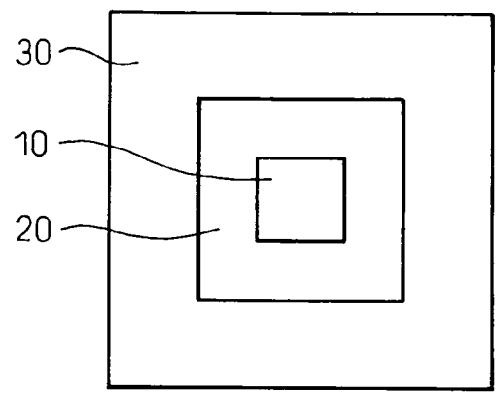
FIGS. 9(a) and 9(b) illustrate an example in which a reinforcing member (stiffener) is incorporated in the package.
Figure 9B:
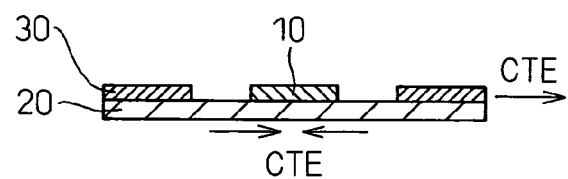

Referring to FIGS. 9(a) and 9(b), a reinforcing member (stiffener) 30 is secured to the uppermost layer of the built-up substrate 20 so as to surround the region for mounting the semiconductor element of the built-up substrate 20 that constitutes the semiconductor package. The stiffener 30 is made of, for example, a glass/epoxy substrate and is secured to the built-up substrate 20 to increase the strength of the semiconductor package (built-up substrate 20) and, particularly, to enhance the rigidity of the region of the substrate 20 for mounting the semiconductor element. In the built-up substrate 20, a portion where the insulating resin is laminated has a relatively low coefficient of linear thermal expansion (CTE) while the stiffener 30 made of the above-mentioned material has a relatively high coefficient of linear thermal expansion (CTE). Therefore, when the substrate 20 is heated such as in the step of reflowing the solder, stress occurs inward in the central portion in the semiconductor element-mounting region and occurs outward in the portions surrounding the semiconductor element-mounting region as indicated by arrows in the drawing. This makes it possible to significantly reduce the coefficient of linear thermal expansion in the junction portion on which the semiconductor element 10 is mounted and in the peripheral portions thereof. As a result, the above region is flattened, and it can be expected that the stress is reduced in the junction portion on which the semiconductor element 10 is mounted.

Figure 10A:
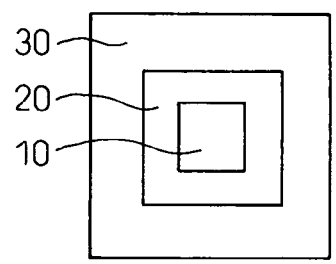
FIGS. 10(a) and 10(b) illustrate a conventional example in which a reinforcing member (stiffener) is incorporated in a multi-layer substrate.
Figure 10B:
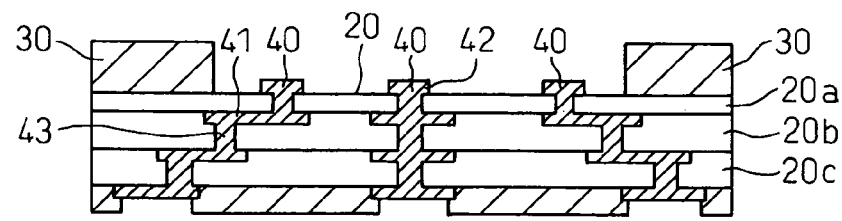

FIGS. 10(a) and 10(b) illustrates a structure in which the stiffener is secured to the uppermost layer of the whole-layer built-up substrate. The insulating resins 20a to 20c of the whole-layer built-up substrate have coefficients of linear thermal expansion of about 20 to about 30 ppm. On the other hand, the stiffener 30 made of the glass/epoxy substrate or the like has a coefficient of linear thermal expansion of about 10 to about 20 ppm. Contrary to the above description related to FIGS. 9(a) and 9(b), therefore, the coefficients of linear thermal expansion of the insulating resin layers 20a to 20c of the whole-layer built-up substrate become greater than the coefficient of linear thermal expansion of the stiffener. Therefore, the region for mounting the semiconductor element expands more than the peripheral portions, developing undulation and losing flatness, and deteriorating reliability in the connection to the semiconductor element. The insulating resin layers 20a to 20c of the built-up laminate 20 are made of, for example, insulating layers alone or a reinforcing member such as a glass cloth impregnated with a resin. In FIGS. 10(a) and 10(b), a conducting portion 40 includes a conducting pattern layers 41 arranged between the insulating resin layers 20a to 20c of the built-up laminate 20, a chip (element) connection portion 42 of the uppermost layer of the laminate, and a via portion 43 for electrically connecting the conducting layers among the insulating resin layers and the chip (element) connection portions.

Figure 11:
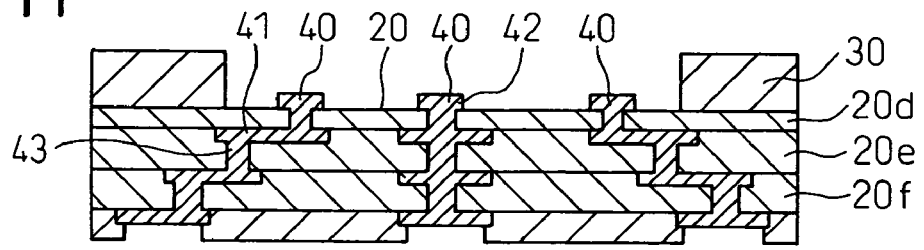
FIG. 11 illustrates an embodiment of the invention in which a prepreg obtained by impregnating a mesh of a liquid crystal polymer with an insulating resin is used.

FIG. 11 illustrates an embodiment in which the stiffener 30 is secured to the uppermost layer of the whole-layer built-up substrate 20 as in the embodiment shown In FIGS. 10(a) and 10(b). What makes a difference from the semiconductor package structure of FIGS. 10(a) and 10(b) is that the insulating resin layers 20d to 20f of the built-up multi-layer laminate 20 are made of a material obtained by impregnating a mesh (woven fabric) of a liquid crystal polymer with an insulating resin as described with reference to FIG. 8 instead of using insulating layers alone or a reinforcing material such as a glass cloth impregnated with a resin. Therefore, the semiconductor package 20 constituted by a multi-layer laminate exhibits a reduced coefficient of linear thermal expansion. In the heating atmosphere, as when the semiconductor element 10 is joined in the step of reflowing the solder, therefore, a force so acts as to pull the stiffener 30 outwardly in the periphery of the semiconductor package and in the central portion, and the force so works that the built-up layers 20d to 20f contract toward the center. Therefore, the semiconductor element-mounting region is flattened, and reliability is improved without developing cracks in the portion where the semiconductor element and the semiconductor package are joined together.

The insulating resin layers 20d to 20f of the built-up multi-layer laminate 20 may all be constituted by using a material obtained by impregnating the mesh (woven fabric) of the liquid crystal polymer with an insulating resin as illustrated in FIG. 11. Further, only some of the layers and, chiefly, a region for mounting the semiconductor element 10 and the peripheral regions thereof only may be constituted as described above, and other insulating resin layers may be made of insulating layers alone or by using a reinforcing material such as a glass cloth impregnated with a resin as illustrated in FIGS. 10(a) and 10(b). By forming at least some of the layers of the built-up multi-layer laminate 20 by using the mesh of the liquid crystal polymer impregnated with the insulating resin as described above, it is possible to reduce the coefficient of linear thermal expansion of the above portion to be, for example, about 0 to about 5 ppm which is close to the coefficient of linear thermal expansion of the semiconductor element 10.

That is, as compared to the built-up insulating resin substrate 20 constituted by the insulating layers alone, the built-up insulating resin substrate 20 including the mesh (woven fabric) of the liquid crystal polymer exhibits a reduced specific inductivity or a reduced dielectric loss tangent and a large mechanical strength. Therefore, the semiconductor package exhibits enhanced electric characteristics and the package by itself exhibits an increased strength.

Thus, as the coefficient of linear thermal expansion (CTE) of the built-up multi-layer laminate 20 is brought close to that of the semiconductor element 10, the region mounting the semiconductor element exhibits CTE of about 3 ppm which is close to that of the semiconductor element 10 and the peripheral portions thereof exhibit CTE of as great as about 15 to 20 ppm. In the heating atmosphere in which the semiconductor element 10 is joined by reflowing the solder, therefore, the substrate of the built-up multi-layer laminate 20 is pulled outwardly whereby the junction portion between the semiconductor element 10 and the semiconductor package 20 is flattened, and the stress is relaxed. Even when there is used a semiconductor element having a relatively low strength, therefore, no crack develops and the reliability is enhanced.

As the liquid crystal polymer, there can be used one of the polyester type or of the polyarylate type, and, desirably, monofilaments of a diameter of 18 to 23 μm. From the standpoint of obtaining the package in a decreased thickness and having a decreased weight, in particular, it is desired that the monofilaments have small diameters. The density of mesh is preferably about V240 to about 380 (number of filaments per a width of one inch).

Figure 12:
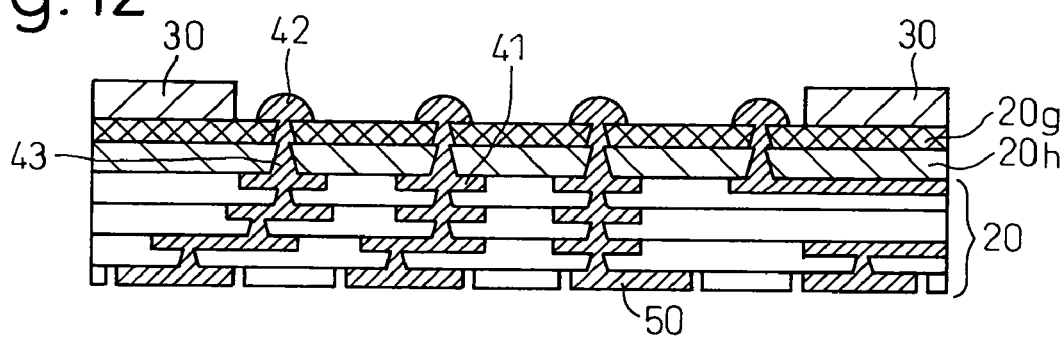
FIG. 12 illustrates an embodiment of the present invention provided with a stress buffer layer.
Figure 13:
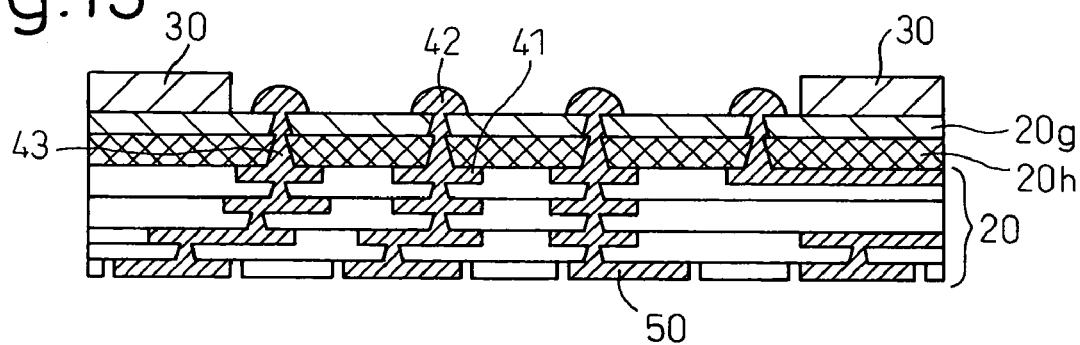
FIG. 13 illustrates another embodiment of the present invention provided with the stress buffer layer.
Figure 14:
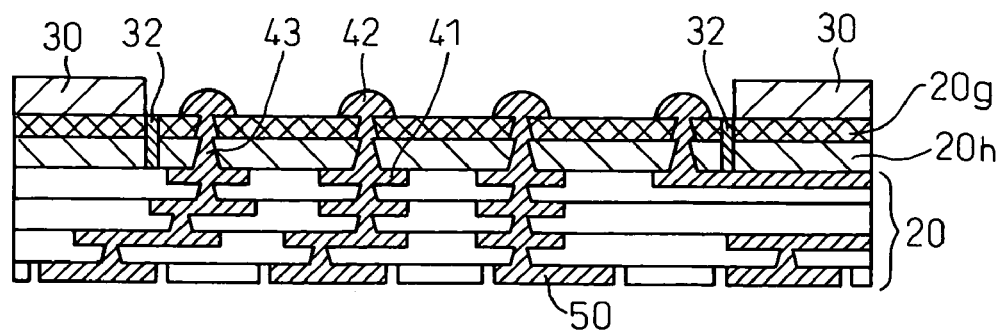
FIG. 14 illustrates a further embodiment of the present invention in which slits are formed in the stress buffer layer.

Referring to FIGS. 12 to 14, two insulating resin layers 20g and 20h are laminated on the multi-layer laminate that constitutes the body 20 of the semiconductor package. The multi-layer laminate 20 forms a multi-layer substrate that is usually used, and in which a plurality of insulating resin layers and a plurality of conducting layers are alternately laminated one upon the other, and there can be obtained laminates of various types. The conducting portion includes a conducting pattern layer 41 arranged among the insulating resin layers of the multi-layer laminate, a chip (element) connection portion (bump) 42 of the uppermost layer of the laminate, and a via portion 43 for electrically connecting the conducting layers among the insulating resin layers and the chip (element) connection portions.

In these embodiments, a blind via 43 is provided in the insulating resin layer 20g which is the uppermost layer and in the next insulating resin layer 20h enabling the conducting pattern 41 on the surface of the multi-layer laminate 20 to be electrically connected to the semiconductor element junction portion 42 of the insulating resin layer 20g which is the uppermost layer, instead of forming the conducting layer (conducting pattern) therebetween. The multi-layer laminate 20 is laminated by a build-up method after the insulating resin layer 20g which the uppermost layer and the next insulating resin layer 20h have been laminated and formed.

The embodiments illustrated in FIGS. 12 to 14 deal with the multi-layer laminate 20 having a built-up structure on one surface thereof. The invention, however, can also be applied to the one having the built-up structure on both surfaces thereof like a metal core substrate.

In any embodiment, the stiffener 30 of the shape of a rectangular frame is attached as a reinforcing member to the outer periphery of the insulating resin layer 20g which is the uppermost layer surrounding the region of mounting the semiconductor element 10. It should be noted that the stiffener 30 can be omitted.

According to the embodiment illustrated in FIG. 12, the insulating resin layer 20g which is the uppermost layer is made of, for example, a liquid crystal polymer or the like having a coefficient of linear thermal expansion of about −5 to about 3 ppm, which is smaller than that of the semiconductor element that is to be mounted. The insulating resin layer 20h under the uppermost layer is made of a material (e.g., containing a rubber component such as silicone) having a low Young's modulus and a high percentage of elongation. Then, the insulating resin layer 20g which is the uppermost layer works to bring the coefficient of linear thermal expansion of the semiconductor element to be mounted into agreement with, or close to, the coefficient of linear thermal expansion of the semiconductor element-mounting region of the insulating resin layer 20g which is the uppermost layer in the step of reflowing the solder, to reduce the stress at the junction portion. The next insulating resin layer 20h works to absorb a difference in the coefficient of linear thermal expansion between the semiconductor element or the insulating resin layer 20g which is the uppermost layer and the package (multi-layer laminate) 20 thereby to reduce the stress that is generated. These two insulating resin layers 20g and 20h cooperate to prevent the occurrence of cracks in the semiconductor element.

According to an embodiment illustrated in FIG. 13, the insulting resin layer 20g which is the uppermost layer is made of a material (e.g., containing a rubber component such as silicone) having a low Young's modulus and a high percentage of elongation. On the other hand, the next insulating resin layer 20h under the uppermost layer is made of, for example, an insulating layer alone or a material obtained by impregnating a reinforcing material such as a glass cloth or the like impregnated with a resin such as an epoxy or a polyimide. This moderates the mismatching in the coefficient of linear thermal expansion between the insulating resin layer 20g which is the uppermost layer and the semiconductor element mounted on the upper surface thereof.

According to an embodiment illustrated in FIG. 14, like in the embodiment of FIG. 12, the insulting resin layer 20g which is the uppermost layer is made of a material having a coefficient of linear thermal expansion of, for example, about −5 to about 3 ppm, which is smaller than the coefficient of linear thermal expansion of the semiconductor element that is mounted, and the next insulating resin layer 20h under the uppermost layer is made of a material (containing, for example, a rubber component) having a low Young's modulus and a high percentage of elongation. In this semiconductor package, further, a notch or a slit 32 is formed on the inside of the stiffener 30 along the periphery of the semiconductor element-mounting portion. The depth of the notch or the slit 32 may correspond to the thickness of one (insulating resin layer 20g of the uppermost layer) of the two insulating resin layers 20g and 20h, or may correspond to the thickness of both of them.

According to the embodiment of FIG. 14, as in the embodiment of FIG. 12, the insulating resin layer 20g which is the uppermost layer works to bring the coefficient of linear thermal expansion of the semiconductor element to be mounted into agreement with, or close to, the coefficient of linear thermal expansion of the semiconductor element-mounting region of the insulating resin layer 20g which is the uppermost layer in the step of reflowing the solder, to relax the stress at the junction portion. The next insulating resin layer 20h works to absorb a difference in the coefficient of linear thermal expansion between the semiconductor element or the insulating resin layer 20g which is the uppermost layer and the package (multi-layer laminate) 20 thereby to relax the stress that is generated. These two insulating resin layers work in cooperation to prevent the occurrence of cracks in the semiconductor element. Besides, the slit 32 surrounding the semiconductor element-mounting portion shuts off the coefficient of linear thermal expansion between the inner mounting region and the outer region, letting them be independent from each other and making it possible to further reduce the stress.

Though the invention was described above by way of embodiments with reference to the accompanying drawings, it should be noted that the invention is in no way limited to the above embodiments only but can be modified, changed or corrected in a variety of ways without departing from the spirit and scope of the invention.

In the embodiments illustrated in FIGS. 12 to 14, for example, two insulating resin layers 20g and 20h are laminated on the package (multi-layer laminate) 20. However, there may be laminated only one insulating resin layer having a low Young's modulus and a high percentage of elongation to obtain the same effect. It should also be in the embodiments illustrated in FIGS. 12 to 14, reference numeral 50 refers to parts of wirings, used as lands or terminal for external electrical connection.

In FIGS. 1, 2 and 4 to 7, the semiconductor package 20 is not illustrated in a multi-layered form for simplicity. In practice, however, a plurality of insulating resin layers are laminated as the built-up multi-layer substrate, and conducting (pattern) layers are formed among the insulating resin layers, the conductor pattern layers being electrically connected to each other through via layers that are not shown. In FIG. 8, the conducting pattern layers are not illustrated, either.

According to the present invention, as described above, no stress or a decreased amount of stress exists between the semiconductor element and the semiconductor package mounting the semiconductor element, preventing the occurrence of stress in the junction between the two. Further, the region for mounting the element is flattened. Even when a semiconductor element having a small strength is used, therefore, the strength is maintained in the junction portion between the semiconductor element and the package preventing the occurrence of cracks.

The invention claimed is:

1. A package for a semiconductor device comprising:
   a laminate of many layers, as a whole-layer build-up substrate, including a plurality of conducting layers and a plurality of insulating resin layers that are alternately laminated one upon other;
   a semiconductor element mounting portion formed on one surface of the laminate to connect to a semiconductor element;
   one of the insulating resin layers defining the one surface of the laminate on which said semiconductor element mounting portion is formed being constituted by a prepreg obtained by impregnating a woven fabric of a liquid crystal polymer impregnated with an insulating resin;
   the other insulating resin layers being constituted by only insulating resin;
   an external connecting portion formed on an opposite surface of the laminate; and
   a thermal expansion coefficient of the semiconductor element mounting portion being closer to that of the semiconductor element than to that of the insulating resin layers.

2. The package for a semiconductor device according to claim 1, wherein the thermal expansion coefficient of the semiconductor element mounting portion is 0 to 5 ppm.

3. The package for a semiconductor device according to claim 1, wherein the woven fabric of the liquid crystal polymer comprises monofilaments of a diameter of 18 to 23 μm and a mesh density of V240 to 380.

4. A package for a semiconductor device comprising:
   a laminate of many layers, as a whole-layer build-up substrate, including a plurality of conducting layers and a plurality of insulating resin layers that are alternately laminated one upon other;
   a semiconductor element mounting portion formed on one surface of the laminate to connect to a semiconductor element;
   one of the insulating resin layers defining the one surface of the laminate on which said semiconductor element mounting portion is formed being constituted by a prepreg obtained by impregnating a woven fabric of a liquid crystal polymer with an insulating resin;
   the other insulating resin layers are insulating layers other than said prepreg;
   an external connecting portion formed on an opposite surface of the laminate; and
   a thermal expansion coefficient of the semiconductor element mounting portion being closer to that of the semiconductor element than to that of the insulating resin layers.

* * * * *

UNITED STATES PATENT AND TRADEMARK OFFICE
CERTIFICATE OF CORRECTION

PATENT NO. : 7,285,856 B2 Page 1 of 1
APPLICATION NO. : 10/855979
DATED : October 23, 2007
INVENTOR(S) : Kazuhiko Ooi et al.

It is certified that error appears in the above-identified patent and that said Letters Patent is hereby corrected as shown below:

Column 8, Line 21, change "In" to --in--.

Signed and Sealed this

Thirteenth Day of May, 2008

JON W. DUDAS
*Director of the United States Patent and Trademark Office*